United States Patent [19]

Ozawa

[11] Patent Number: 4,737,920
[45] Date of Patent: Apr. 12, 1988

[54] METHOD AND APPARATUS FOR CORRECTING ROTATIONAL ERRORS DURING INSPECTION OF RETICLES AND MASKS

[75] Inventor: Haruo Ozawa, Tokyo, Japan

[73] Assignee: Nippon Kogaku K. K., Tokyo, Japan

[21] Appl. No.: 675,897

[22] Filed: Nov. 28, 1984

[30] Foreign Application Priority Data

Nov. 30, 1983 [JP] Japan ............................ 58-226347

[51] Int. Cl.[4] ..................... G01B 11/26; G01B 21/00; G01B 21/22
[52] U.S. Cl. .................... 364/490; 356/394; 356/401; 358/101; 364/491
[58] Field of Search ............... 364/488, 489, 490, 491, 364/525; 356/400, 401, 394, 397, 372, 150; 382/44, 45, 46; 358/101; 901/46, 47; 355/53

[56] References Cited

U.S. PATENT DOCUMENTS

| | | | |
|---|---|---|---|
| 2,427,256 | 9/1947 | Butscher | 88/14 |
| 2,950,649 | 8/1960 | Horn | 88/39 |
| 3,598,978 | 8/1971 | Rempert | 364/490 |
| 3,667,848 | 6/1972 | Percival | 356/153 |
| 3,752,589 | 8/1973 | Kobayashi | 356/172 |
| 3,817,626 | 6/1974 | Lietar | 356/168 |
| 3,854,822 | 12/1974 | Altman et al. | 356/394 |
| 3,902,811 | 9/1975 | Altman et al. | 356/394 |
| 4,040,746 | 8/1977 | Lietar | 356/168 |
| 4,103,998 | 8/1978 | Nakazawa et al. | 364/490 |
| 4,167,677 | 9/1979 | Suzki | 356/401 |
| 4,233,625 | 11/1980 | Altman | 382/44 |
| 4,328,553 | 5/1982 | Fredriksen et al. | 364/559 |
| 4,362,839 | 12/1982 | Koizumi et al. | 356/156 |
| 4,421,410 | 12/1983 | Karasaki | 356/394 |
| 4,435,835 | 3/1984 | Sahow et al. | 358/101 |
| 4,448,532 | 5/1984 | Joseph et al. | 356/394 |
| 4,450,579 | 5/1984 | Nakashima et al. | 382/44 |
| 4,508,453 | 4/1985 | Hara et al. | 356/394 |
| 4,515,480 | 5/1985 | Miller et al. | 356/394 |
| 4,545,683 | 10/1985 | Markle | 356/400 |
| 4,579,455 | 4/1986 | Levy et al. | 356/394 |
| 4,629,313 | 12/1986 | Tanimoto | 355/53 |
| 4,630,225 | 12/1986 | Hisano | 364/559 |

FOREIGN PATENT DOCUMENTS 56-141508 5/1981 Japan .
57-34402 2/1982 Japan .

Primary Examiner—Parshotam S. Lall
Assistant Examiner—Daniel W. Juffernbruch
Attorney, Agent, or Firm—Shapiro and Shapiro

[57] ABSTRACT

A method and apparatus for inspecting masks and reticles by simplifying rotational alignment thereof so as to shorten alignment time is proposed wherein a rotational angle representing a rotational error between a reference substrate and a substrate to be inspected is measured in advance, the substrate to be inspected being provided with the same circuit patterns as those of the reference substrate in one-to-one correspondence, a position of a stage having these substrates thereon is automatically measured, and a measurement error caused by the rotational error can be automatically corrected, thereby providing accurate measured values.

9 Claims, 5 Drawing Sheets

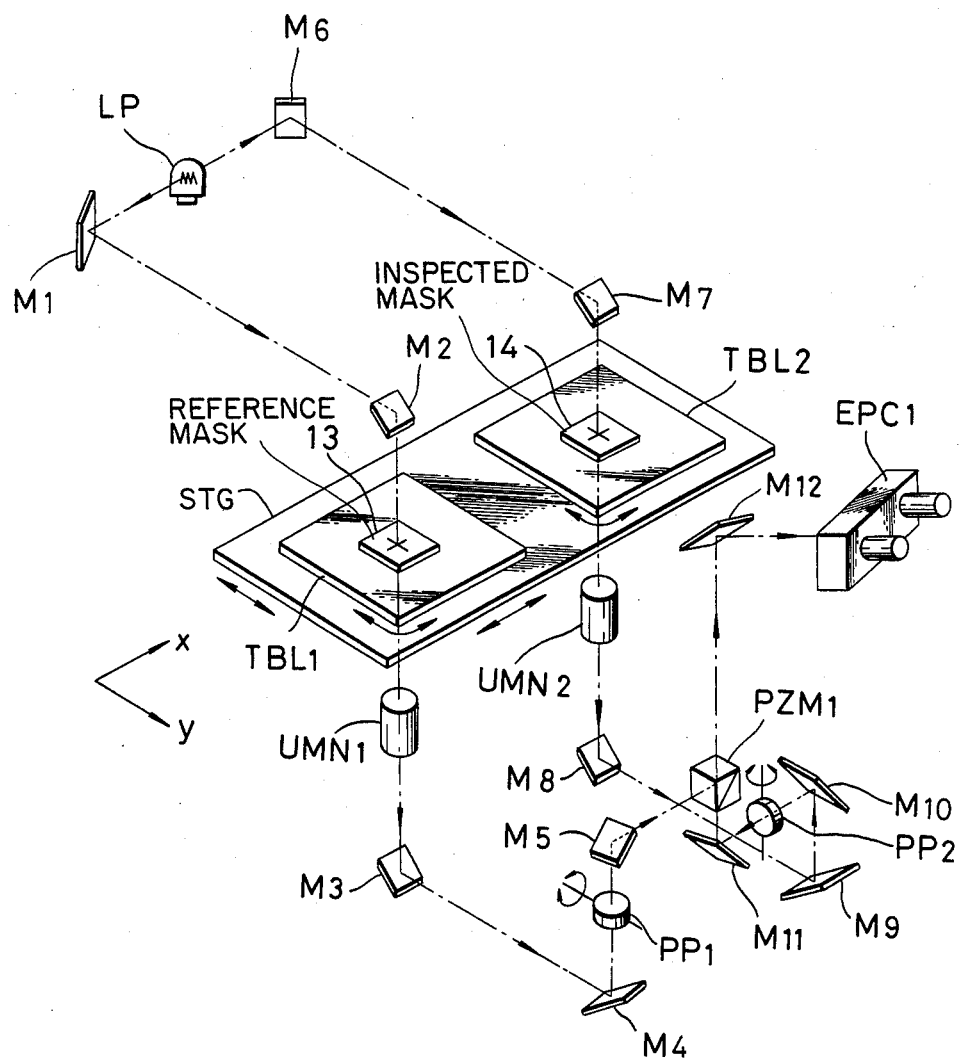
F I G. 1

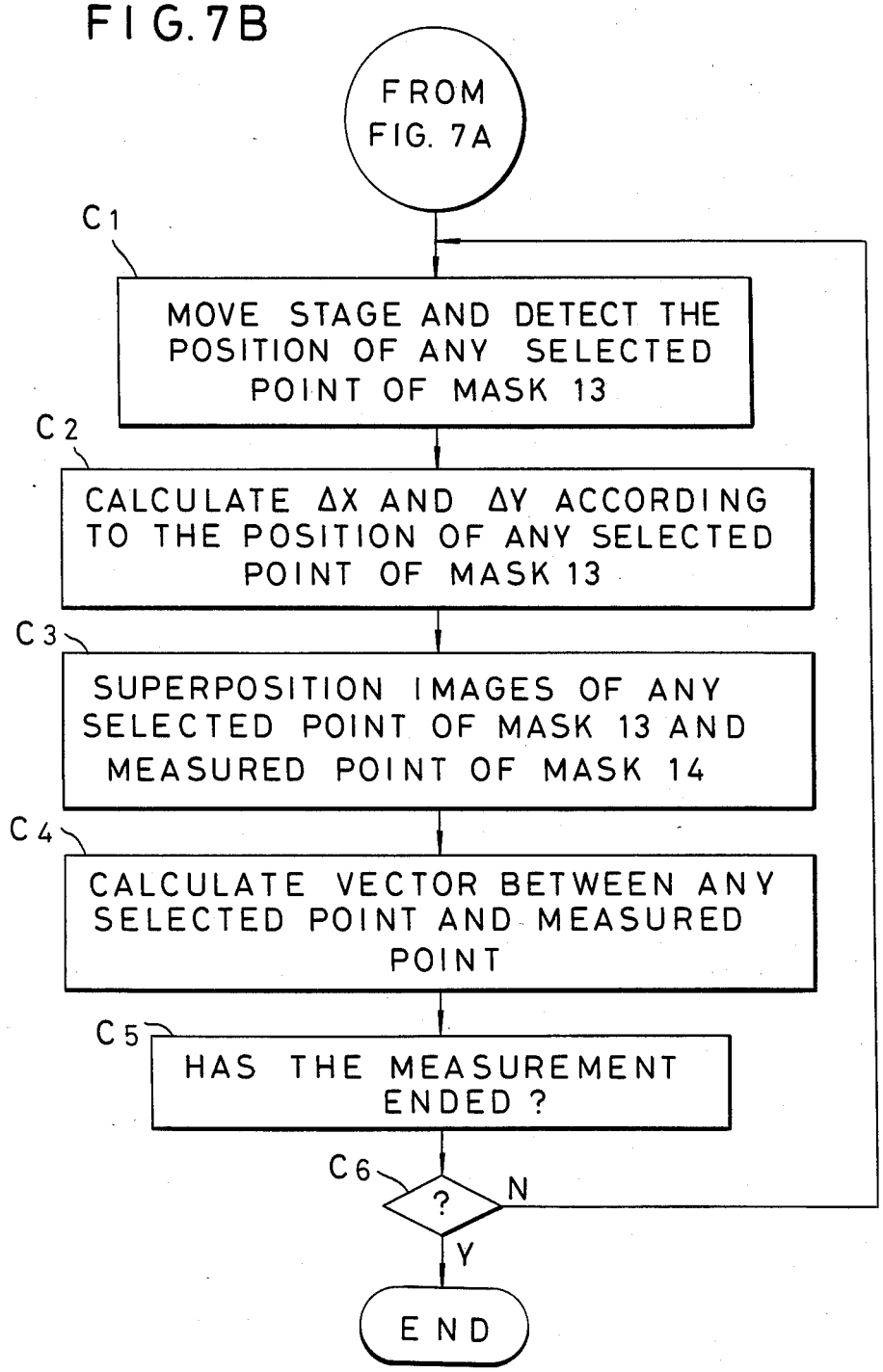

METHOD AND APPARATUS FOR CORRECTING ROTATIONAL ERRORS DURING INSPECTION OF RETICLES AND MASKS

BACKGROUND OF THE INVENTION

1. Field of the Invention

The present invention relates to a method and apparatus for correcting rotational errors during inspection of two flat objects, more particularly, semiconductor fabrication masks.

2. Description of the Prior Art

In order to fabricate semiconductor devices, a mask or reticle is used. The mask or reticle has a light-transmitting portion and a light-shielding portion which constitute a circuit pattern to be exposed on a wafer. The mask and reticle must be formed with a desired circuit pattern and with desired precision. An inspection apparatus is required to compare the inspected mask and reticle with a reference mask and reticle before being used to fabricate semiconductor devices.

A conventional mask inspection apparatus is known wherein the positions of points of a reference mask having a plurality of circuit patterns are compared with the positions of corresponding points of a mask to be inspected. The mask to be inspected has the same circuit patterns as those in the reference mask in one-to-one correspondence. In a mask inspection apparatus of this type, the reference mask is placed parallel to the mask to be inspected. The circuit patterns of these masks are enlarged by a pair of objective lenses, and the resultant mask images (i.e., the enlarged pattern images of the masks) are superposed and observed in the same field of view so that pattern error of the mask to be inspected can be detected. For this purpose, the mask inspection apparatus has a stage for simultaneously moving the two masks in a two-dimensional manner. A first fine adjustment table is rotatably mounted on one side of an upper surface of the stage and supports and rotates the reference mask. A second fine adjustment table is rotatably mounted on the other side of the upper surface of the stage and supports and rotates the mask to be inspected.

By rotating the first and second fine adjustment tables, the reference mask and the mask to be inspected are aligned such that an optical positional relationship between the reference mask and a corresponding objective lens corresponds to that between the mask to be inspected and a corresponding objective lens. Two-dimensional (x,y) alignment errors (translational errors) can be easily eliminated by movement of two linked plane parallel plates of a photoelectric micrometer. However, a rotational error must be eliminated by manually rotating the first and second adjustment tables. If the rotational error is not eliminated, it appears as errors of measured values of the relative positions of respective points of the masks. Therefore, conventionally, a high degree of skill is required for physically aligning the two masks to eliminate rotational alignment errors, thus increasing the alignment time.

SUMMARY OF THE INVENTION

The present invention provides an improved method and apparatus for correcting rotational errors during inspection of reticles and masks. The high degree of skill required to minimize rotational alignment errors in accordance with the prior art is not required by the present invention, and alignment time is reduced.

In accordance with the invention, a rotational angle representing a rotational alignment error between a reference substrate and a substrate to be inspected is determined prior to measurement of the relative positions of corresponding points on the reference substrate and the substrate to be inspected.

More particularly, in accordance with the invention two substrates, such as a reticle or a mask, are mounted on corresponding tables supported on a stage that is movable two-dimensionally in a plane (along x and y coordinate axes). The tables are relatively rotatable on the plane of the stage about axes perpendicular to the lane of the stage. Alignment of the substrates two-dimensionally along the x and y coordinate axes is readily achieved as in the prior art, but in accordance with the invention it is unnecessary to obtain precise rotational alignment of the substrates. Instead, the relative rotational angle of the two substrates is calculated in accordance with data representing the two-dimensional position of the stage and data obtained from superposed optical images of the substrates. From the calculated relative rotational angle, correction vectors are produced to compensate for the relative rotational angle between the two substrates when measurements are made (e.g., in accordance with conventional practices) to determine the displacement between positions of corresponding points on the two substrates. By virtue of the invention, when the substrate to be inspected is compared with a reference substrate to determine pattern errors in the inspected substrate, the effect of the relative rotational angle between the two substrates is eliminated.

BRIEF DESCRIPTION OF THE DRAWINGS

FIG. 1 is a schematic view of a mask inspection apparatus;

FIG. 7B is a flow chart for explaining the remaining part of the operation of the apparatus shown in FIG. 2.

DETAILED DESCRIPTION OF THE PREFERRED EMBODIMENT

FIG. 1 is a schematic view showing a mask inspection apparatus to which the present invention is applied. Illumination light from a lamp LP illuminates a reference mask 13 through mirrors M1 and M2. The reference mask 13 is placed on a first fine adjustment table TBL1. The first table TBL1 finely adjusts the rotational direction of the reference mask 13. The first table TBL1 has an opening with a size corresponding to a predetermined region (e.g., a region of circuit patterns such as an LSI and a VLSI) of the mask. The illumination light is transmitted through this opening. The transmitted light is incident on an image forming prism PZM1 through an objective lens UMN1 of a microscope, mirrors M3 and M4, a first plane parallel plate PP1 and a mirror M5. The light from the lamp LP also illuminates through mirrors M6 and M7 a mask 14 to be inspected. The mask 14 is placed on a second fine adjustment table TBL2. The second table TBL2 finely adjusts the mask 14 along the x and y directions. The second table TBL2 also has the same opening as in the first table TBL1. Light is transmitted through the mask 14, an objective lens UMN2 of the microscope, mirrors M8, M9 and M10, a second plane parallel plate PP2, and a mirror M11 and is incident on the prism PZM1. The images of the masks 13 and 14 are superposed by the prism PZM1. The superposed images can be observed through a mirror M12 and the eyepiece EPC1.

The first plane parallel plate PP1 is used to move the image of the mask 13 along the y direction. A displacement of the image of mask 13 is photoelectrically measured by a photoelectric micrometer or the like. The second plane parallel plate PP2 is used to move the image of the mask 14 in the x direction. A displacement of the image of mask 14 is also photoelectrically measured. A stage STG moves the first and second tables together along the x or y direction.

Figure 2:
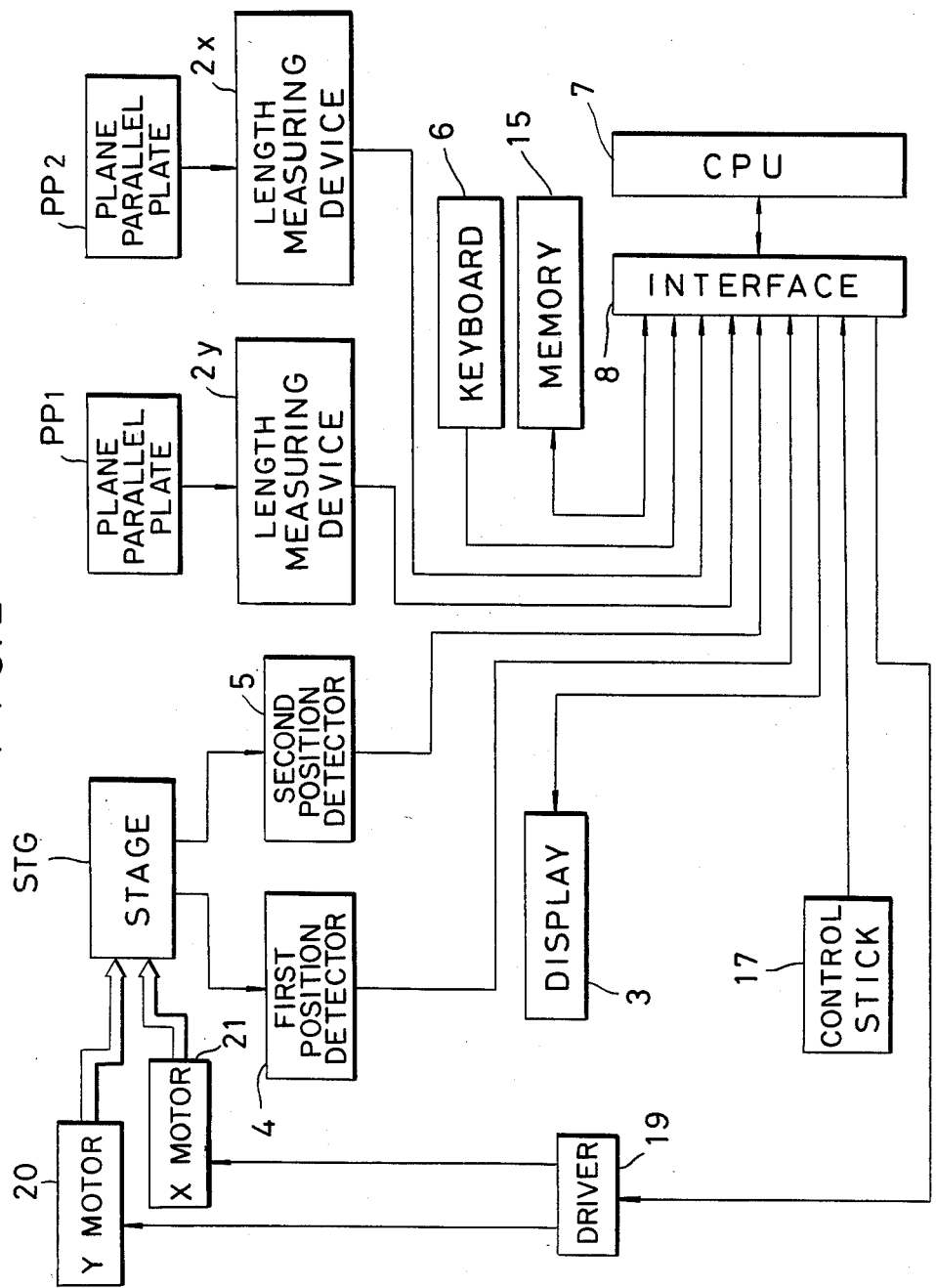
FIG. 2 is a block diagram of a mask inspection apparatus according to an embodiment of the present invention.

FIG. 2 is a block diagram of a circuit of a mask inspection apparatus according to an embodiment of the present invention that corresponds to the one illustrated in FIG. 1. A first position detector 4 detects an x-coordinate of the stage STG, and a second position detector 5 detects a y-coordinate of the stage STG. The first and second detectors 4 and 5 comprise detectors such as potentiometers, photoelectric linear encoders or magnetic scales. Length measuring devices 2y and 2x measure displacements of the first and second plane parallel plates PP1 and PP2 to independently measure displacements of the mask image along the x and y directions. A keyboard 6 is used to store data (to be described later) in a microcomputer (to be referred to as a CPU hereinafter) 7 and a memory 15 through an interface 8. A control stick 17 is used to cause x and y motors 21 and 20 to move the stage STG through a driver 19 in the x and y directions.

The length measuring device 2x incorporates a counter for counting an x-coordinate error of the image. Similarly, the length measuring device 2y incorporates a counter for counting a y-coordinate error. In addition, the first position detector 4 incorporates a counter for counting an x displacement of the stage STG, and the second position detector 5 incorporates a counter for counting a y displacement of the stage STG. The x and y displacement data of the mask images which are generated from the first and second length measuring devices 2x and 2y, the x- and y-coordinate data of the stage STG which are generated from the first and second position detectors 4 and 5, and operation signals from the keyboard 6 are supplied to the CPU 7. The data generated from the CPU 7 is displayed on a data display 3.

Figure 3:
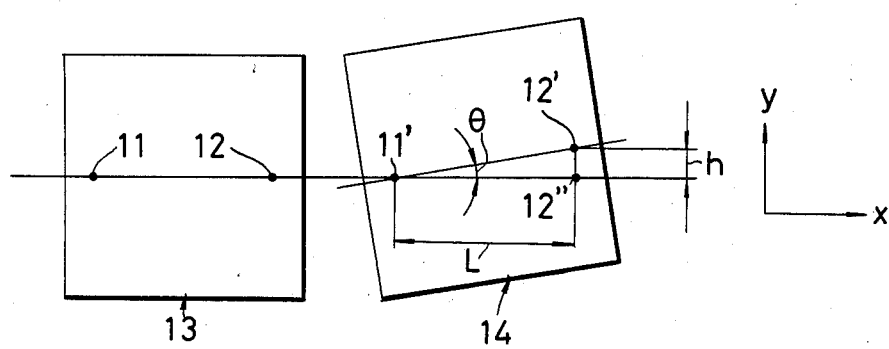
FIG. 3 is a representation showing a state wherein two masks are aligned by the apparatus shown in FIG. 2.

FIG. 3 is a representation showing the aligned state of the masks 13 and 14. The measurement of a relative rotational angle between the masks 13 and 14 will be described with reference to FIGS. 2 and 3. The image of a leftmost point 11 of the mask 13 is aligned with the image of a corresponding point 11' of the mask 14. This alignment is performed by moving the first and second plane parallel plates PP1 and PP2. The operation signals are entered at the keyboard 6 and are supplied to the CPU 7. The CPU 7 receives as origin data a count of a counter which represents a relationship between the x- and y-coordinates of the images of the masks 13 and 14 since these coordinates are respectively measured by the first and second length measuring devices 2x and 2y. Thus, the CPU 7 sets the origin.

Figure 4:
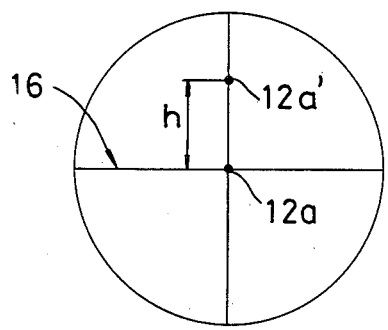
FIG. 4 is a view showing an image observed by a microscope eyepiece EPC1.

The stage STG is moved along the x direction until an image 12a of a point 12 and an image 12a' of a point 12' appear within the view of the eyepiece EPC1, as shown in FIG. 4. Referring to FIG. 4, the image 12a of the rightmost point 12 of the mask 13 is located at an intersection of a reticle 16, and the image 12a' of the rightmost point 12' of the mask 14 is distant from the image 12a. In this case, a displacement distance L of the stage STG (between points 11' and 12" of mask 14) can be calculated in accordance with a count of the stage x-coordinate counter in the first position detector 4. Subsequently, the first plane parallel plate PP1 is moved to superpose the image 12a of the point 12 of the mask 13 on the image 12a' of the point 12' of the mask 14. The second length measuring device 2y measures a relative y-coordinate error h between the image 12a of the point 12 and the image 12a' of the point 12'. The relative y-coordinate error h is entered in response to an instruction at the keyboard 6 and is then fetched to the CPU 7. A rotational angle between the masks 13 and 14 is calculated in accordance with the following equation:

$$\theta = \sin^{-1} h/L \qquad (E1)$$

The calculated result is stored in the memory 15.

Figure 5:
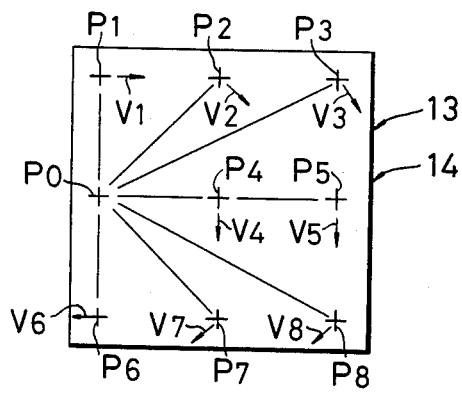
FIG. 5 is a representation showing mask correction values when the two masks are aligned as shown in FIG. 3.

FIG. 5 is a representation showing a state wherein the masks 13 and 14 are assumed to be superposed. A point P0 corresponds to the points 11 and 11' in FIG. 3 and serves as the origin of the stage position when the rotational angle $\theta$ is calculated. When the rotational angle $\theta$ is not zero, position errors of points P1, P2, P3, ..., and P8 are represented by vectors V1 to V8, respectively.

Figure 6:
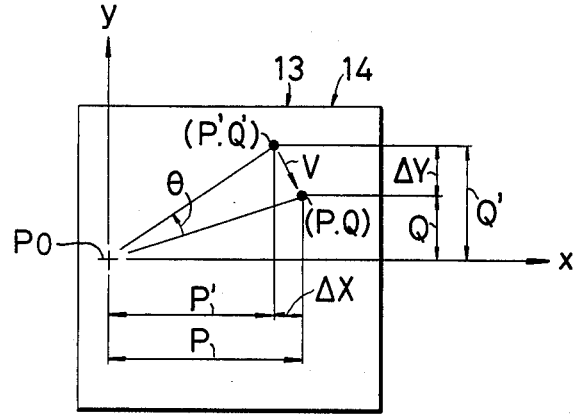
FIG. 6 is a representation showing coordinates of corresponding points of the two masks when these masks are aligned as shown in FIG. 3.

FIG. 6 is a representation illustrating a rotational alignment error and the determination of correction values for the elimination of the error. Assume that a true coordinate point to be measured with respect to the origin P0 is defined as (P,Q), and that coordinates of the actually measured point are given as (P',Q') due to the rotational angle $\theta$. In this case, the following correction values $\Delta X$ and $\Delta Y$, defining a corresponding vector V, are required for correcting measured x- and y-coordinates of a point to obtain the true x- and y-coordinates:

$$\Delta X = P - P' = P - (P \cos \theta - Q \sin \theta) \qquad (E2)$$

$$\Delta Y = Q - Q' = Q - (P \sin \theta + Q \cos \theta) \qquad (E3)$$

Figure 7A:
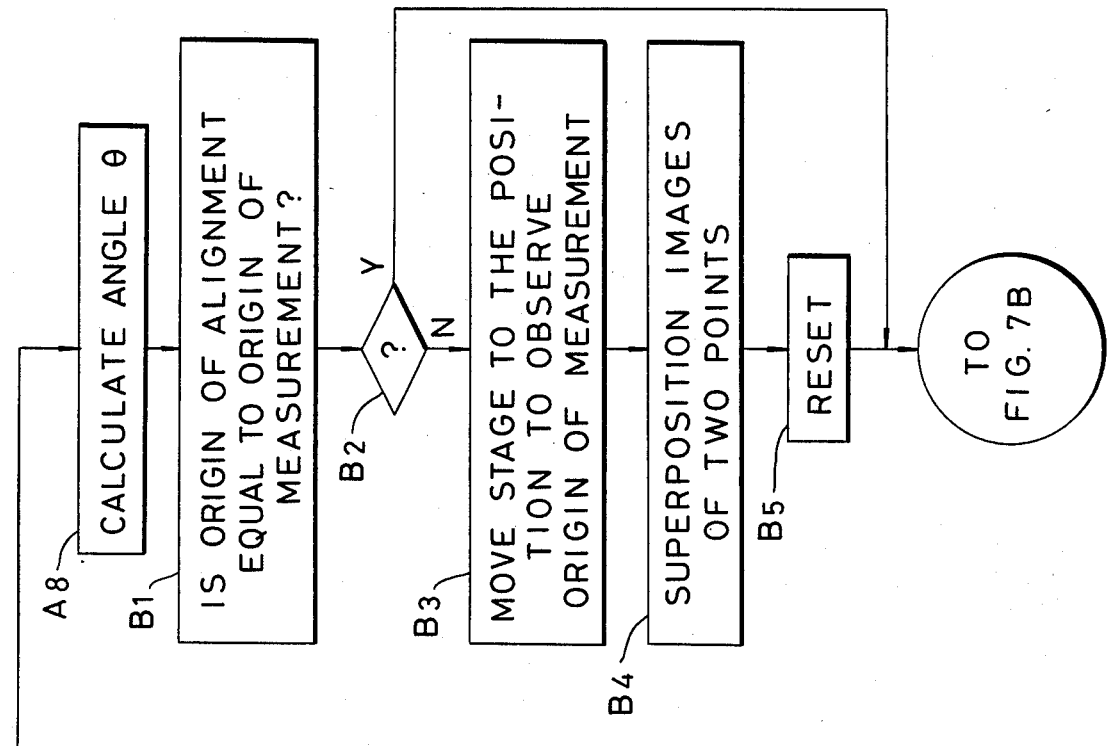
FIG. 7A is a flow chart for explaining part of the operation of the apparatus shown in FIG. 2.
Figure 7A:
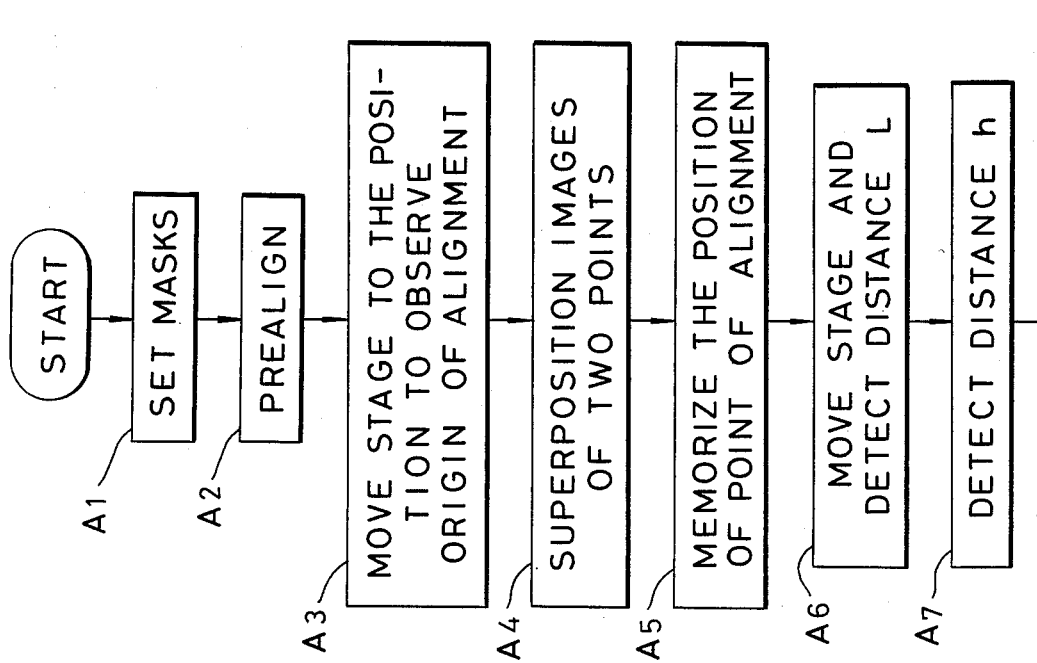

The steps for an operator to perform actual operations will be described with reference to the flow charts in FIGS. 7A and 7B. Referring to the flow chart in FIG. 7A, in step A1, the masks 13 and 14 are set by a loader (not shown) on the stage STG. In step A2, the operator causes the first table TBL1 to rotate the mask 13 and the second table TBL2 to rotate the mask 14, thereby prealigning the masks 13 and 14. In step A3, the operator operates the control stick 17 to move the stage STG so that the image 11a of the point 11 of the mask 13 which is regarded as the origin of alignment and the image 11a' of the point 11' are moved into the central portion of the field of view of the microscope. In other words, the operator moves the stage STG so that the images of the points 11 and 11' are substantially located at the intersection of the reticle 16 in FIG. 4. In step A4, the operator moves the plane parallel plates PP1 and PP2 to completely superpose the image of the point 11' of the mask 14 on the image of the point 11 of the mask 13. Thereafter, in step A5, the CPU 7 fetches as origin data the counts of the counters in the first and second position detectors 4 and 5 and the counts of the counters in the first and second length measuring devices 2x and 2y upon operation by the operator of an origin input switch (not shown) in the keyboard 6. The CPU 7 causes the display 3 to display that the x- and y-coordinates of the stage STG are zero. The operator at the mask inspection apparatus must confirm that the x- and y-coordinates displayed on the display 3 are zero (i.e., x=0 and y=0). In step A6, when the operator moves the stage STG so that the images 12a and 12a' of the points 12 and 12' are located substantially at the center line of the field of view of the microscope (see FIG. 4), the CPU 7 calculates the distance L. Subsequently, in step A7, the operator moves the first and second plane parallel plates PP1 and PP2 to superpose the images of the points 12 and 12' of the masks 13 and 14, and the CPU 7 detects the distance h. The flow advances to step A8, and the operator turns on a correction input switch (not shown) in the keyboard 6. The outputs from the first position detector 4 and the first length measuring device 2y are fetched by the CPU 7, and the rotational angle θ is calculated in accordance with equation (E1). Errors between any point of the mask 13 and the corresponding point of the mask 14 upon operation of the first and second plane parallel plates PP1 and PP2 are corrected by equations (E2) and (E3), thereby automatically obtaining corrected values which do not include the rotational angle θ. The display 3 displays Y=0, and the operator can confirm the display.

The operator decides in steps B1 and B2 whether the origins 11 and 11' of alignment become equal to the origin P0 of measurement. If NO in step B1 and B2, the flow advances to step B3. The operator moves the stage STG to the position to observe the origin of measurement. In step B4, the operator moves the plane parallel plates PP1 and PP2 to superpose the corresponding two images of the masks 13 and 14. In step B5, the operator depresses the reset switch in the keyboard 6 to set the origin of measurement. When the operator checks that X=0 and Y=0 are displayed, the begins measurement of the corresponding points between the masks 13 and 14.

Referring to the flow chart in FIG. 7B, in step C1 the operator moves the stage STG so that any selected point of the mask 13 is located substantially at the center of the field of view of the microscope. The CPU 7 detects the position of the selected point in accordance with outputs from the first and second position detectors 4 and 5. In step C2, the CPU 7 calculates the correction values ΔX and ΔY by using the positions of the points detected by the first and second position detectors 4 and 5 in accordance with equations (E2) and (E3). The calculated values are stored in the memory 15. In step C3, the operator moves the plane parallel plates PP1 and PP2 to superpose the corresponding points of the masks 13 and 14. In step C4, the CPU 7 calculates from ΔX and ΔY a vector representing an error in a displacement (measured by conventional techniques) between the position of the selected coordinate point of the mask 13 in step C3 and the position of the corresponding point of the mask 14. The vectors are displayed on the display 3. The operator corrects the measured displacement values with reference to the vectors displayed on the display 3 and enters the corrected displacement values.

What is claimed is:

1. An apparatus for correcting rotational alignment errors in the inspection of two substrates to determine differences between corresponding patterns thereon, said apparatus comprising:
   (a) stage means for disposing both of said substrates thereon;
   (b) moving means for moving said stage means along a rectangular coordinates system;
   (c) means for producing an image of each of said substrates disposed on said stage means and for superposing said images;
   (d) position detecting means responsive to said stage means for detecting the position of said stage means within said rectangular coordinates system and for generating output signals;
   (e) first displacement means for providing a relative displacement between the produced images of said substrates in one direction;
   (f) second displacement means for providing a relative displacement between the produced images of said substrates in another direction which is perpendicular to said one direction;
   (g) displacement detecting means responsive to said first and second displacement means for detecting the relative displacements of said images in said directions and for generating output signals;
   (h) memory means; and
   (i) calculating means for calculating a relative rotational angle of said substrates on said stage means on the basis of output signals of said position detecting means and said displacement detecting means and for providing said calculated angle to said memory means for storage therein, said calculating means subsequently calculating correction values for providing corrected values of measured relative displacements between positions of corresponding points on said images, respectively, on the basis of said calculated angle stored in said memory means.

2. An apparatus according to claim 1, wherein said first displacement means and said second displacement means are operative to provide said relative displacements between the images of said substrates without moving said substrates.

3. An apparatus according to claim 2, wherein each of said first and second displacement means includes a plane parallel plate, respectively.

4. An apparatus according to claim 3, which further comprises display means responsive to said calculating means for displaying said corrected values.

5. A method of correcting relative rotational alignment errors of a pair of substrates having corresponding patterns thereon that are compared to determine differences between said patterns, and in which measurements are made of displacements between selected corresponding points on said patterns, which comprises:
   (a) disposing both of said substrates on a stage;
   (b) moving said stage along a plane;
   (c) detecting the position of said stage along said plane in a two-dimensional coordinate system;
   (d) providing an image of each of said substrates disposed on said stage;

(e) providing relative displacements between said images in said two-dimensional coordinate system;
(f) detecting said displacements of said images;
(g) calculating a relative rotational angle of said substrates on said stage in response to said detecting of said position of said stage and said detecting of said image displacements; and
(h) determining from said rotational angle correction values for the correction of measured displacements between positions of corresponding points on said patterns.

6. A method according to claim 5, wherein said calculating of said relative rotational angle comprises superposing said images, moving said stage along said plane in a first coordinate direction to determine a first distance between two points in one of said images along said first direction, relatively displacing said images until one of said two points in one of said images coincides with a corresponding point in the other of said images to determine a second distance along a second coordinate direction perpendicular to said first direction, and determining said relative rotational angle from said distances.

7. A method of correcting relative rotational alignment errors of a pair of substrates having corresponding patterns thereon that are compared to determine differences between said patterns, and in which measurements are made of displacements between selected corresponding points on said patterns, which comprises:
(a) forming an image of each of said substrates;
(b) moving said images in a two-dimensional coordinate system;
(c) calculating in response to the moving of said images a relative rotational angle of said substrates in a plane of said coordinate system, said calculating being performed trigonometrically from the coordinates of a point on one of said images with respect to an origin of said coordinate system and comprising moving said one of said images along two directions parallel to said coordinates, respectively, and measuring corresponding amounts of movement; and
(d) determining from said relative rotational angle correction values for the correction of measured displacements between the positions of corresponding points on said patterns in said coordinate system.

8. A method of correcting relative rotational alignment errors of a pair of substrates having corresponding patterns thereon that are compared to determine differences between said patterns, and in which measurements are made of displacements between selected corresponding points on said patterns, which comprises:
(a) forming an image of each of said substrates;
(b) moving said images in a two-dimensional coordinate system;
(c) calculating in response to the moving of said images a relative rotational angle of said substrates in a plane of said coordinate system, said calculating comprising causing a first point in one of said images to coincide with a corresponding first point in the other of said images at a reference position, moving said images along one of said coordinates to cause a second point in said one image to be disposed at said reference position and measuring the amount of such movement, moving the other image along the other of said coordinates to cause a second point in said other image corresponding to the second point in said one image to be disposed at said reference position and measuring the amount of that movement, and determining the relative rotational angle from the measured amounts of movement; and
(d) determining from said relative rotational angle correction values for the correction of measured displacements between the positions of corresponding points on said patterns in said coordinate system.

9. A method according to claim 8, wherein the first mentioned moving is performed by moving said substrates and wherein the second mentioned moving is performed without moving said substrates.

* * * * *